US012796304B2

(12) United States Patent
Kim et al.

(10) Patent No.: US 12,796,304 B2
(45) Date of Patent: Nov. 10, 2026

(54) DISPLAY DEVICE

(71) Applicant: Samsung Display Co., Ltd., Yongin-si (KR)

(72) Inventors: Ran Kim, Yongin-si (KR); Kihyun Kim, Yongin-si (KR); Younggil Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 422 days.

(21) Appl. No.: 18/515,583

(22) Filed: Nov. 21, 2023

(65) Prior Publication Data

US 2024/0276854 A1 Aug. 15, 2024

(30) Foreign Application Priority Data

Feb. 15, 2023 (KR) ........................ 10-2023-0020258

(51) Int. Cl.

*H10K 59/88* (2023.01)
*H10K 59/122* (2023.01)
*H10K 59/127* (2023.01)
*H10K 59/38* (2023.01)
*H10K 59/70* (2023.01)
*H10K 102/00* (2023.01)

(52) U.S. Cl.

CPC ........... *H10K 59/88* (2023.02); *H10K 59/122* (2023.02); *H10K 59/127* (2023.02); *H10K 59/38* (2023.02); *H10K 59/70* (2023.02); *H10K 2102/351* (2023.02)

(58) Field of Classification Search

CPC ....... H10K 59/122; H10K 59/88; H10K 59/38
USPC .................................................. 313/498–512
See application file for complete search history.

(56) References Cited

U.S. PATENT DOCUMENTS

| | | | | |
|---|---|---|---|---|
| 2021/0202852 A1* | 7/2021 | Lee | ........................ | C23C 14/042 |
| 2022/0157893 A1* | 5/2022 | Baek | ....................... | H10K 59/38 |
| 2022/0328581 A1* | 10/2022 | Kim | ........................ | H10K 59/38 |
| 2023/0030101 A1* | 2/2023 | Bae | ........................ | H10W 90/00 |
| 2023/0041748 A1* | 2/2023 | Tak | ....................... | H10H 29/142 |
| 2023/0148430 A1* | 5/2023 | Kim | ................... | H10H 20/8512 257/89 |
| 2023/0282682 A1* | 9/2023 | Kim | ..................... | H10H 20/841 |

FOREIGN PATENT DOCUMENTS

| | | | | |
|---|---|---|---|---|
| KR | 10-1285535 B1 | 7/2013 | | |
| KR | 20190081909 A * | 7/2019 | ........... | G09G 3/2096 |
| KR | 10-2020-0032294 A | 3/2020 | | |
| KR | 10-2021-0142031 A | 11/2021 | | |
| KR | 10-2022-0105253 A | 7/2022 | | |

* cited by examiner

*Primary Examiner* — Christopher M Raabe
(74) *Attorney, Agent, or Firm* — Womble Bond Dickinson (US) LLP

(57) ABSTRACT

A display device includes: a first base substrate; a display structure on the first base substrate; a bank portion on the display structure and defining a pixel opening and a dummy opening adjacent to the pixel opening; a color conversion layer in the pixel opening of the bank portion; and a capping layer covering the bank portion and the color conversion layer and including: a first layer on the bank portion and including silicon oxide; and a second layer on the first layer and including silicon oxynitride in the dummy opening.

20 Claims, 11 Drawing Sheets

DISPLAY DEVICE

CROSS-REFERENCE TO RELATED APPLICATION

The present application claims priority to and the benefit of Korean Patent Application No. 10-2023-0020258, filed on Feb. 15, 2023, in the Korean Intellectual Property Office, the entire content of which is incorporated herein by reference.

BACKGROUND

1. Field

Aspects of some embodiments relate generally to a display device.

2. Description of Related Art

A display device is a device that displays images to provide visual information to users. Among display devices, an organic light emitting diode display has recently been attracting attention.

Recently, in order to improve display quality, a display device including a first substrate including a plurality of pixels and a color conversion layer and a second substrate including a color filter layer has been proposed. The color conversion layer may convert a wavelength of light provided from the pixels. Accordingly, a display device including the color conversion layer may emit light having a color different from a color of incident light. For example, the color conversion layer may include wavelength conversion particles such as quantum dots.

The above information disclosed in this Background section is only for enhancement of understanding of the background and therefore the information discussed in this Background section does not necessarily constitute prior art.

SUMMARY

Aspects of some embodiments relate generally to a display device. For example, aspects of some embodiments relate to a flat display device Aspects of some embodiments include a display device having relatively improved reliability.

A display device according to some embodiments of the present disclosure includes a first base substrate, a display structure on the first base substrate, a bank portion on the display structure and defining a pixel opening and a dummy opening adjacent to the pixel opening, a color conversion layer in the pixel opening of the bank portion, and a capping layer covering the bank portion and the color conversion layer and including: a first layer on the bank portion and including silicon oxide and a second layer on the first layer and including silicon oxynitride in the dummy opening.

According to some embodiments, the first layer may directly contact a side surface of the bank portion in the dummy opening.

According to some embodiments, a thickness of the capping layer overlapping the side surface of the bank portion may range from about 1500 Å to about 10000 Å.

According to some embodiments, the dummy opening may include seven or less sub-dummy openings.

According to some embodiments, a shape of each of the sub-dummy openings may be a circular or a polygon with octagons or less.

According to some embodiments, when a shape of each of the sub-dummy openings a polygon, a corner of the polygon may be rounded.

According to some embodiments, the display device may further include a sub-capping layer between the bank portion and the capping layer, including silicon oxynitride, and having a nitrogen content of about 10 at % to about 40 at % in the silicon oxynitride.

According to some embodiments, the capping layer may include a third layer on the second layer and including silicon oxide.

According to some embodiments, the display device may further include a second base substrate facing the first base substrate, a color filter layer under the second base substrate, and a filling layer between the color filter layer and the capping layer.

According to some embodiments, the display structure may include a driving element on the first base substrate, a light emitting diode on the driving element and connected to the driving element, and an encapsulation layer on the light emitting diode.

A display device according to some embodiments of the present disclosure includes a first base substrate, a display structure on the first base substrate, a bank portion on the display structure and defining a pixel opening and a dummy opening adjacent to the pixel opening, a color conversion layer in the pixel opening of the bank portion, and a capping layer covering the bank portion and the color conversion layer and including a first layer on the bank portion, including silicon oxide in the dummy opening, and having a thickness range between about 1500 Å and 10000 Å.

According to some embodiments, the first layer may directly contact a side surface of the bank portion in the dummy opening.

According to some embodiments, the thickness range of the first layer may be a thickness range of a part overlapping a side surface of the bank portion.

According to some embodiments, the capping layer may further include a second layer on the first layer and including silicon oxide.

According to some embodiments, the dummy opening may include seven or less sub-dummy openings.

According to some embodiments, a shape of each of the sub-dummy openings may be a circular or a polygon with octagons or less.

According to some embodiments, when a shape of each of the sub-dummy openings a polygon, a corner of the polygon may be rounded.

According to some embodiments, the display device may further include a sub-capping layer between the bank portion and the capping layer, including silicon oxynitride, and having a nitrogen content of about 10 at % to about 40 at % in the silicon oxynitride.

According to some embodiments, the display device may further include a second base substrate facing the first base substrate, a color filter layer under the second base substrate, and a filling layer between the color filter layer and the capping layer.

According to some embodiments, the display structure may include a driving element on the first base substrate, a light emitting diode on the driving element and connected to the driving element, and an encapsulation layer on the light emitting diode.

In a display device according to some embodiments, a capping layer may include a first layer directly contacting a bank portion and including silicon oxide, and a second layer on the first layer and including silicon oxynitride. Due to this, the oxidation resistance of the capping layer can be relatively improved, and the capping layer can effectively prevent or reduce outgassing. Accordingly, non-curing of the filling layer contacting the capping layer can be prevented or reduced, luminous efficiency of the display device can be relatively improved, and reliability of the display device can be relatively improved.

When a dummy opening includes seven or less sub-dummy openings and a shape of the sub-dummy opening is a polygon with octagons or less, the number of sides of the capping layer overlapping the side surfaces of the bank portion may be reduced. As a result, an area oxidized in the capping layer can be relatively reduced. Accordingly, non-curing of the filling layer contacting the capping layer can be prevented or reduced, and reliability of the display device can be relatively improved.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
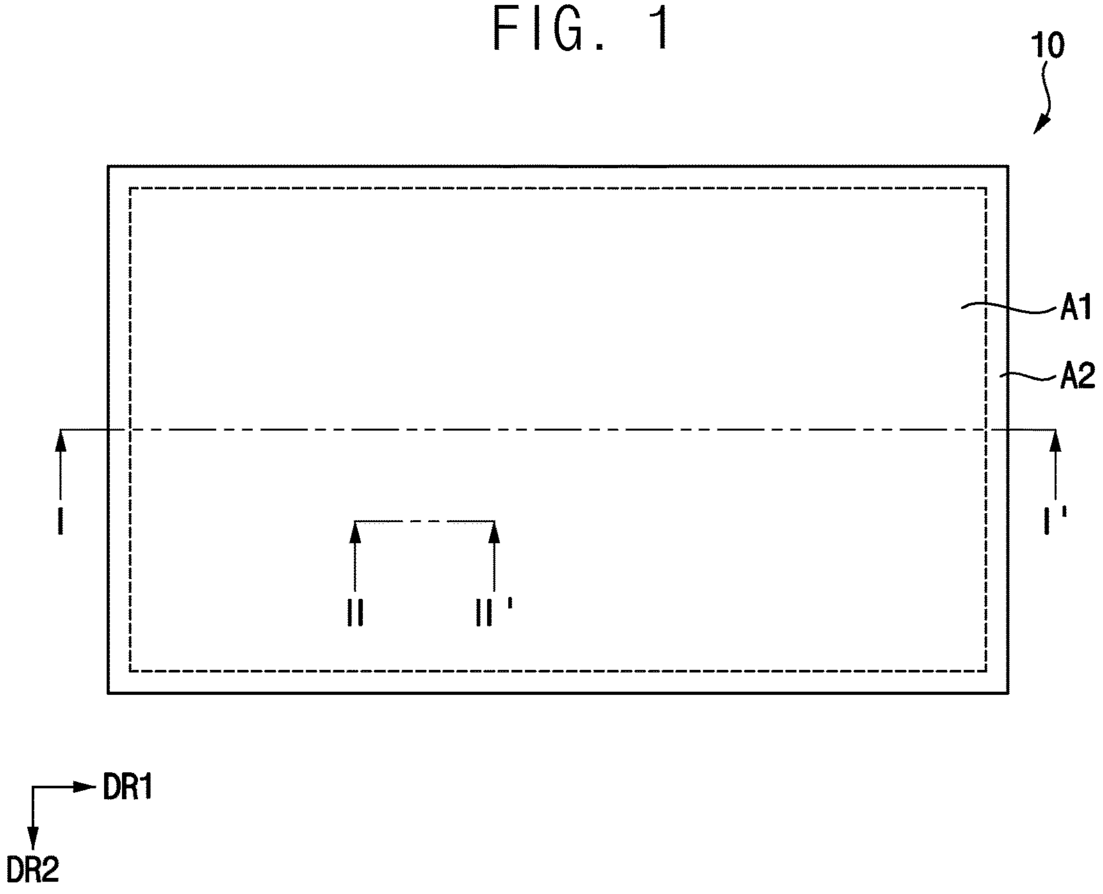
FIG. 1 is a plan view illustrating a display device according to some embodiments of the present disclosure.

Hereinafter, a display device according to some embodiments of the present disclosure will be explained in more detail with reference to the accompanying drawings. The same reference numerals are used for the same components in the drawings, and redundant descriptions of the same components will be omitted.

In this specification, a plane may be defined as a first direction DR1 and a second direction DR2 crossing the first direction DR1. For example, the first direction DR1 and the second direction DR2 may be perpendicular to each other. The plane defined by the first direction DR1 and the second direction DR2 may be parallel to a display surface of a display device 10. A direction normal or perpendicular to the plane, that is, a thickness direction of the display device 10 may be a third direction DR3. In other words, the third direction DR3 may be perpendicular to each of the first and second directions DR1 and DR2.

Figure 2:
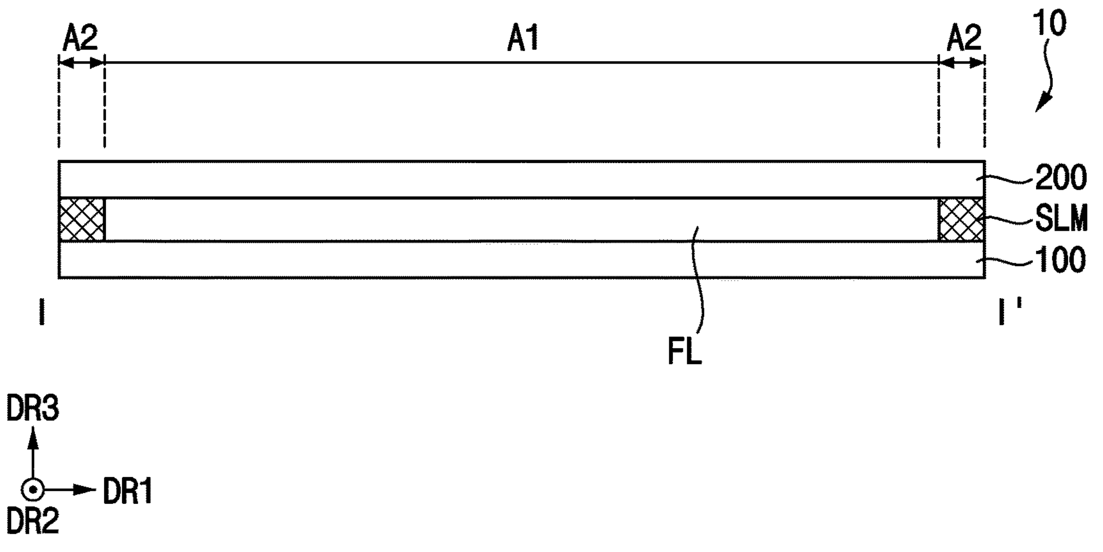
FIG. 2 is a cross-sectional view taken along the line I-I' of FIG. 1 according to some embodiments of the present disclosure.

FIG. 1 is a plan view illustrating a display device according to some embodiments of the present disclosure. FIG. 2 is a cross-sectional view taken along the line I-I' of FIG. 1.

Referring to FIGS. 1 and 2, the display device 10 may include a first substrate 100, a sealing member SLM, and a second substrate 200. The second substrate 200 may face the first substrate 100. The second substrate 200 may be positioned in the third direction DR3 from the first substrate 100. For example, the third direction DR3 may be a front direction of the display device 10 from the first substrate 100.

The sealing member SLM may be located between the first substrate 100 and the second substrate 200. The sealing member SLM may couple the first substrate 100 and the second substrate 200 together. The sealing member SLM may overlap the second area A2.

The display device 10 may include a first area A1 where images are displayed and a second area A2 surrounding the first area A1. For example, the first area A1 may be a display area, and the second area A2 may be a non-display area. For example, the second area A2 may be a sealing area. However, embodiments according to the present disclosure are not limited thereto.

The first substrate 100 may include a display structure. The display structure may include a plurality of pixels. The pixels may be located in the first area A1 of the first substrate 100. However, embodiments according to the present invention are not limited thereto, and the display structure may be located even in the second area A2.

Each of the pixels may include a driving element and a light emitting diode. The driving element may include at least one thin film transistor. The light emitting diode may generate light according to a driving signal. For example, the light emitting diode may be an inorganic light emitting diode or an organic light emitting diode.

Figure 3:
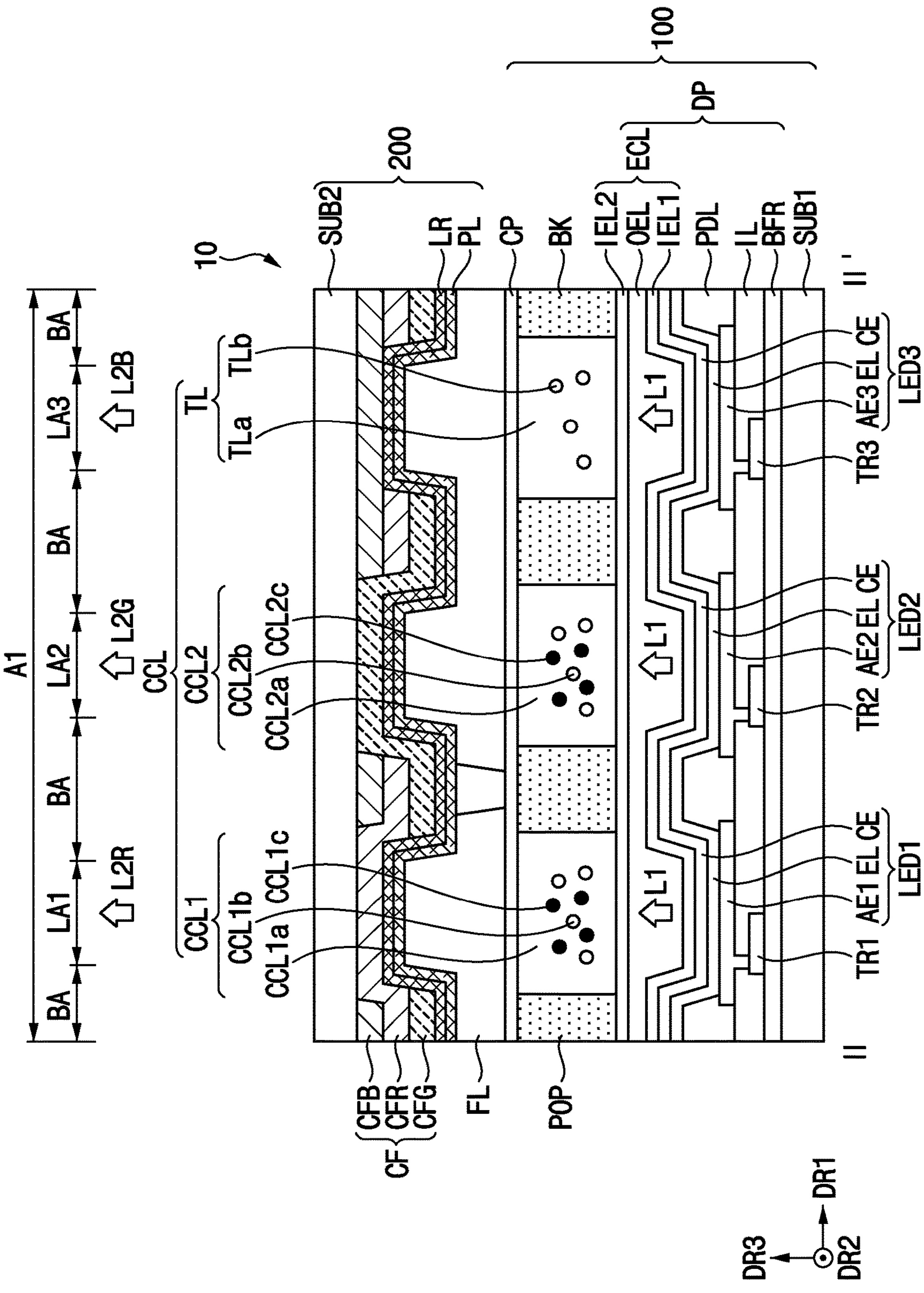
FIG. 3 is a cross-sectional view taken along the line II-II' of FIG. 1 according to some embodiments of the present disclosure.

In addition, the first substrate 100 may include a color conversion layer (e.g., a color conversion layer CCL of FIG. 3). The color conversion layer may be located in the first area A1 and may convert a wavelength of light generated from the light emitting diode.

The second substrate 200 may include a color filter layer that transmits light of a specific color. However, embodiments according to the present disclosure are not limited thereto, and instead of the first substrate 100, the second substrate 200 may include the color conversion layer located under the color filter layer.

The sealing member SLM may be located between the first substrate 100 and the second substrate 200 and may be located in the second area A2. For example, the sealing member SLM may be located in the second area A2 between the first substrate 100 and the second substrate 200 so as to surround the first area A1 in a plan view.

For example, the sealing member SLM may have a hollow rectangular planar shape. However, embodiments according to the present disclosure are not limited thereto, and the sealing member SLM may have various planar shapes according to the planar shapes of the first substrate 100 or the second substrate 200. For example, when the first substrate 100 or the second substrate 200 has a planar shape such as a triangle, a rhombus, a polygon, a circle, or an ellipse, the sealing member SLM may have a planar shape such as a hollow triangle, a hollow rhombus, a hollow polygon, a polygon circle, or a hollow ellipse.

The filling layer FL may be located between the first substrate 100 and the second substrate 200. For example, the filling layer FL may act as a buffer against external pressure applied to the display device 10. For example, the filling layer FL may maintain a gap between the first substrate 100 and the second substrate 200. However, embodiments according to the present disclosure is not limited thereto.

Figure 4:
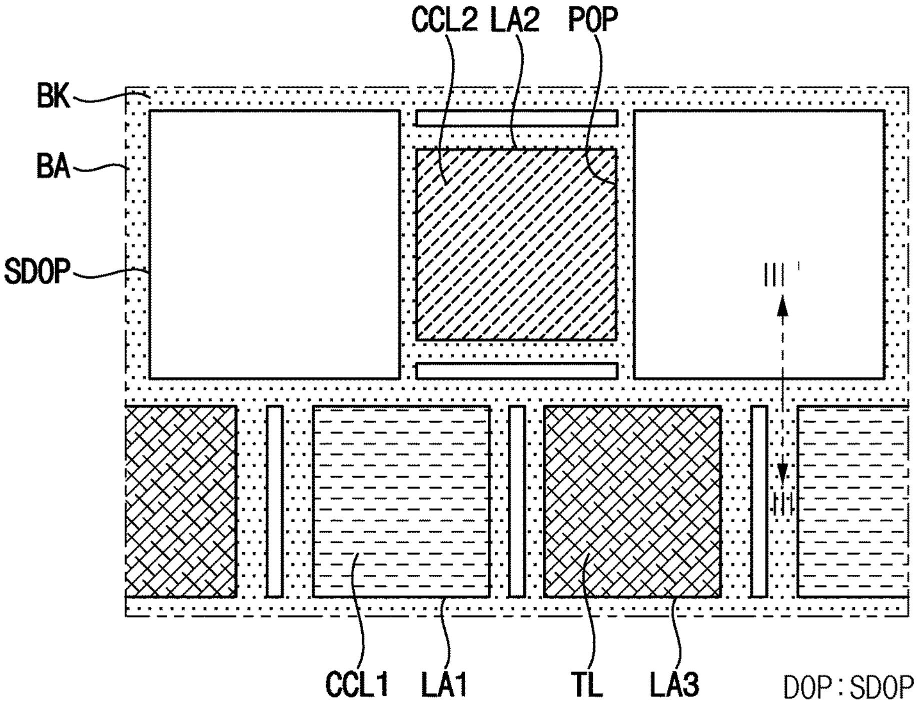
FIG. 4 is a plan view illustrating a first substrate of FIG. 3 according to some embodiments of the present disclosure.

FIG. 3 is a cross-sectional view taken along the line II-II' of FIG. 1. FIG. 4 is a plan view illustrating a first substrate of FIG. 3.

Referring to FIGS. 3 and 4, the first area A1 may include a light emitting area and a light blocking area BA. Light (hereinafter referred to as incident light) L1 generated by a light emitting diode LED included in the first substrate 100 and incident to the second substrate 200 may be emitted to the outside through the light emitting area. The light emitting area may include first, second, and third light emitting areas LA1, LA2, and LA3 for emitting light of different colors. For example, a first transmission light L2R having a red color may be emitted from the first light emitting area LA1, a second transmission light L2G having a green color may be emitted from the second light emitting area LA2, and a third transmission light L2B having a blue color may be emitted from the third light emitting area LA3. According to some embodiments, the first, second, and third light emitting areas LA1, LA2, and LA3 may be spaced apart from each other in the plan view and may be arranged to repeat each other. The light blocking area BA may surround the first, second, and third light emitting areas LA1, LA2, and LA3 in the plan view. For example, the light blocking area BA may have a grid shape in the plan view.

According to some embodiments, the first substrate 100 may include a first base substrate SUB1, a display structure DP, a bank portion BK, a color conversion layer CCL, and a capping layer CP. The display structure DP may be located on the first base substrate SUB1. The bank portion BK and the color conversion layer CCL may be located on the display structure DP. The capping layer CP may be located on the bank portion BK and the color conversion layer CCL. The display structure DP may include a buffer layer BFR, first, second, and third driving elements TR1, TR2, and TR3, an insulating layer IL, a pixel defining layer PDL, first, second, and third light emitting diodes LED1, LED2, and LED3, and an encapsulation layer ECL.

The first base substrate SUB1 may include the first area A1 and the second area A2 as the display device 10 includes the first area A1 and the second area A2.

The first base substrate SUB1 may be an insulating substrate formed of a transparent or opaque material. According to some embodiments, the first base substrate SUB1 may include glass. In this case, the first substrate 100 may be a rigid display substrate. According to some embodiments, the first base substrate SUB1 may include plastic. In this case, the first substrate 100 may be a flexible display substrate.

The buffer layer BFR may be located on the first base substrate SUB1. The buffer layer BFR may prevent or reduce instances of impurities or contaminants such as oxygen and moisture diffusing onto the first base substrate SUB1 through the first base substrate SUB1. The buffer layer BFR may include an inorganic material such as a silicon compound, a metal oxide, or the like. The buffer layer BFR may have a single-layer structure or a multi-layer structure including a plurality of insulating layers.

The first, second, and third driving elements TR1, TR2, and TR3 may be located in the first area A1 on the buffer layer BFR. Each of the first, second, and third driving elements TR1, TR2, and TR3 may include at least one thin film transistor. A channel layer of the thin film transistor may include an oxide semiconductor, a silicon semiconductor, or an organic semiconductor. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), zinc (Zn), and the like. The silicon semiconductor may include amorphous silicon, polycrystalline silicon, and the like.

The insulating layer IL may cover the first, second, and third driving elements TR1, TR2, and TR3. The insulating layer IL may include a combination of an inorganic insulating layer and an organic insulating layer.

The first, second, and third light emitting diodes LED1, LED2, and LED3 may be located on the insulating layer IL. For example, first, second, and third pixel electrodes AE1, AE2, and AE3 may be located on the insulating layer IL. Each of the first, second, and third pixel electrodes AE1, AE2, and AE3 may include a conductive material such as a metal, an alloy, a conductive metal nitride, a conductive metal oxide, a transparent conductive material, and the like. Each of the first, second, and third pixel electrodes AE1, AE2, and AE3 may have a single-layer structure or a multi-layer structure including a plurality of conductive layers.

The first, second, and third pixel electrodes AE1, AE2, and AE3 may be electrically connected to the first, second, and third driving elements TR1, TR2, and TR3 through contact holes formed in the insulating layer IL, respectively.

The pixel defining layer PDL may be located on the first, second, and third pixel electrodes AE1, AE2, and AE3. The pixel defining layer PDL may include an organic material. The pixel defining layer PDL may define a pixel opening exposing at least a part of each of the first, second, and third pixel electrodes AE1, AE2, and AE3.

The light emitting layer EL may be located on the first, second, and third pixel electrodes AE1, AE2, and AE3 exposed by the pixel opening of the pixel defining layer PDL. According to some embodiments, the light emitting layer EL may continuously extend on the first area A1 over a plurality of pixels. According to some embodiments, the light emitting layer EL may be separated from the light emitting layer of an adjacent pixel.

The light emitting layer EL may include at least one of an organic light emitting material or quantum dots. According to some embodiments, the light emitting layer EL may generate blue light. However, embodiments of the present disclosure are not limited thereto. According to some embodiments, the light emitting layer EL may generate red light or green light, or may generate lights having different colors according to pixels.

For example, all of the light emitting layers EL may include an organic material for emitting blue light. In this case, the light emitting layer EL may be formed in multiple layers and may have a structure in which a plurality of blue organic light emitting layers are stacked. For example, the light emitting layer EL may have a structure in which three blue organic light emitting layers are stacked.

However, embodiments according to the present disclosure are not limited thereto, and the light emitting layer EL may have a structure in which a plurality of blue organic light emitting layers and an organic light emitting layer that emits light of different colors are stacked. For example, the light emitting layer EL may have a structure in which three blue organic light emitting layers and one green organic light emitting layer are stacked. According to some embodiments, functional layers such as a hole injection layer, a hole transport layer, an electron transport layer, and an electron injection layer may be located above and/or below the light emitting layer EL.

The common electrode CE may be located on the light emitting layer EL. The common electrode CE may include a conductive material such as a metal, an alloy, a conductive metal nitride, a conductive metal oxide, a transparent conductive material, and the like. The common electrode CE may have a single-layer structure or a multi-layer structure including a plurality of conductive layers. According to some embodiments, the common electrode CE may continuously extend on the first area A1 over the plurality of pixels.

The first pixel electrode AE1, the light emitting layer EL, and the common electrode CE may form the first light emitting diode LED1, the second pixel electrode AE2, the light emitting layer EL, and the common electrode CE may form the second light emitting diode LED2, and the third pixel electrode AE3, the light emitting layer EL, and the common electrode CE may form the third light emitting diode LED3.

The light emitting diodes LED1, LED2, and LED3 may respectively overlap the pixels PX defined by the opening OP. Accordingly, the color conversion layer CCL may be located on the light emitting diodes LED1, LED2, and LED3.

The encapsulation layer ECL may be located on the common electrode CE. The encapsulation layer ECL may include at least one inorganic encapsulation layer and at least one organic encapsulation layer. According to some embodiments, the encapsulation layer ECL may include a first inorganic encapsulation layer IEL1 located on the common electrode CE, an organic encapsulation layer OEL located on the first inorganic encapsulation layer IEL1, and a second inorganic encapsulation layer IEL2 located on the organic encapsulation layer OEL.

The bank portion BK may be located on the encapsulation layer ECL. The bank portion BK may define a pixel opening POP and a dummy opening DOP. The pixel opening POP may define the pixels PX. For example, as shown in FIG. 4, the pixel opening POP of the bank portion BK may expose the first, second, and third light emitting areas LA1, LA2, and LA3, respectively. The pixel opening POP may accommodate an ink composition in the process of forming the color conversion layer CCL. The dummy opening DOP may be adjacent to the pixel opening POP. The color conversion layer CCL may not be located in the dummy opening DOP. For example, the bank portion BK may entirely overlap the light blocking area BA and may have a grid shape in the plan view.

In addition, the bank portion BK may further define other openings positioned between the pixel openings POP in addition to the pixel opening POP and the dummy opening DOP. The other openings may have smaller areas than the pixel opening POP and the dummy opening DOP. The color conversion layer CCL may not be located in the other openings. However, embodiments according to the present disclosure are not limited thereto, and the other openings may be omitted.

According to some embodiments, the dummy opening DOP may include seven or less sub-dummy openings SDOP. For example, the dummy opening DOP may include one sub-dummy opening SDOP. The shape of the sub-dummy opening SDOP may be a circular or a polygon with octagons or less. For example, the shape of the sub-dummy opening SDOP may be a rectangle. However, the present disclosure is not limited thereto.

Figure 5:
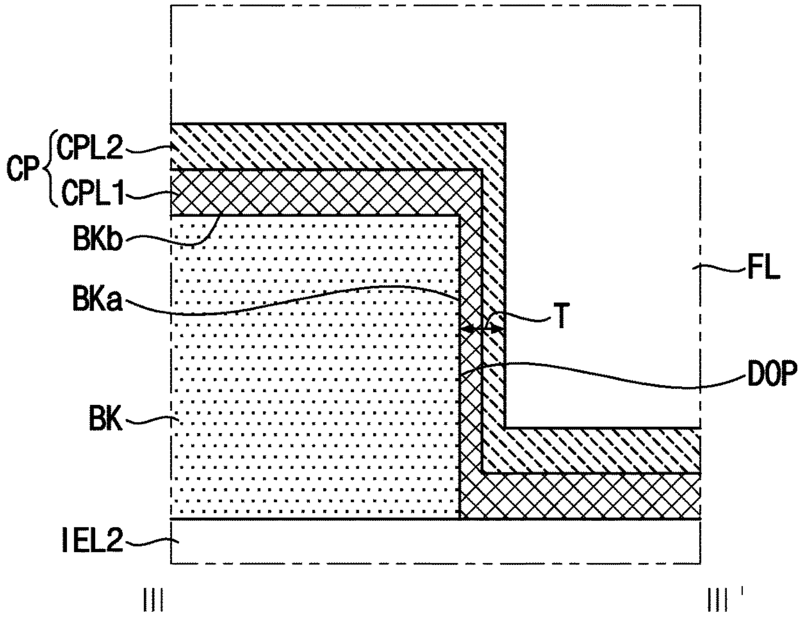
FIG. 5 is a cross-sectional view taken along the line III-III' of FIG. 4 according to some embodiments of the present disclosure.

When the capping layer CP is located in the dummy opening DOP, the thickness of a part overlapping the side surface of the bank portion BK in the capping layer CP may be smaller than the thickness of a part overlapping the upper surface of the bank portion BK in the capping layer CP (see FIG. 5). Accordingly, a part of the capping layer CP overlapping a side surface BKa of the bank portion BK may be easily oxidized. When the dummy opening DOP includes eight or more sub-dummy openings SDOP, the number of surfaces of the capping layer CP overlapping the side surface of the bank portion BK may increase. As a result, an area oxidized in the capping layer CP may increase. In addition, the filling layer FL contacting the oxidized capping layer CP may not be hardened. Therefore, the reliability of the display device 10 may deteriorate.

Similarly, when the shape of the sub-dummy opening SDOP is a polygon having nine or more angles, the number of surfaces of the capping layer CP overlapping the side surface BKa of the bank portion BK may increase. As a result, an area oxidized in the capping layer CP may increase. The filling layer FL contacting the oxidized capping layer CP may not be hardened. Therefore, the reliability of the display device 10 may deteriorate.

According to some embodiments, the bank portion BK may include an organic material. According to some embodiments, the bank portion BK may further include a light blocking material. For example, at least a part of the bank portion BK may include a light blocking material such as black pigment, dye, carbon black, and the like.

The color conversion layer CCL may be located in the pixel opening POP of the bank portion BK. The color conversion layer CCL may be located on the encapsulation layer ECL. The color conversion layer CCL may include color conversion portions spaced apart from each other.

According to some embodiments, the color conversion layer CCL may include a first color conversion portion CCL1, a second color conversion portion CCL2, and a transmission portion TL. The first color conversion portion CCL1, the second color conversion portion CCL2, and the transmission portion TL may be located on the encapsulation layer ECL, and overlap the first, second, and third light emitting areas LA1, LA2, and LA3, respectively. For example, the first color conversion portion CCL1, the second color conversion portion CCL2, and the transmission portion TL may be respectively located in the pixel opening POP of the bank portion BK.

The first color conversion portion CCL1 may overlap the first light emitting area LA1. The first color conversion portion CCL1 may convert the incident light L1 into the first transmitted light L2R having red color. For example, the first color conversion portion CCL1 may include a resin portion CCL1*a*, a scattering material CCL1*b*, and a wavelength conversion particle CCL1*c*.

The scattering material CCL1*b* may increase an optical path by scattering the incident light L1 without substantially changing the wavelength of the incident light L1 incident on the first color conversion portion CCL1. The scattering material CCL1*b* may include a metal oxide or an organic material. Alternatively, the scattering material CCL1*b* may be omitted.

According to some embodiments, the wavelength conversion particle CCL1*c* may include a quantum dot. The quantum dot may be defined as a semiconductor material having nanocrystals. The quantum dot has a specific band gap depending on its composition and size. Accordingly, the quantum dots may absorb the incident light L1 and emit light having a different wavelength from a wavelength of the incident light L1. For example, the quantum dot may have a diameter of about 100 nm or less, and for example may have a diameter of about 1 nm to about 20 nm. For example, the wavelength conversion particle CCL1*c* of the first color conversion portion CCL1 may include a quantum dot that absorbs the incident light L1 and emits red light.

The scattering material CCL1*b* and the wavelength conversion particle CCL1*c* may be located in the resin portion CCL1*a*. For example, the resin portion CCL1*a* may include an epoxy-based resin, an acrylic-based resin, a phenol-based resin, a melamine-based resin, a cardo-based resin, an imide-based resin, and the like.

The second color conversion portion CCL2 may overlap the second light emitting area LA2. The second color conversion portion CCL2 may convert the incident light L1 into the second transmission light L2G having a green color. For example, the second color conversion portion CCL2 may include the resin portion CCL2*a*, the scattering material CCL2*b*, and the wavelength conversion particle CCL2*c*. The resin portion CCL2*a* and the scattering material CCL2*b* of the second color conversion portion CCL2 may be substantially the same as or similar to the resin portion CCL1 a and the scattering material CCL1*b* of the first color conversion part CCL1.

The transmission portion TL may overlap the third light emitting area LA3. The transmitting portion TL may transmit the incident light L1 to emit the third transmission light L2B. For example, the transmission portion TL may include a resin portion TLa and a scattering material TLb. The resin portion TLa and the scattering material TLb of the transmission portion TL may be substantially the same as or similar to the resin portion CCL1 a and the scattering material CCL1*b* of the first color conversion portion CCL1.

However, embodiments according to the present disclosure are not limited thereto, and the transmitting portion TL may convert the incident light L1 into the third transmission light L2B having a blue color. In this case, the transmission portion TL may further include wavelength conversion particles including quantum dots that absorb the incident light L1 and emit blue light.

According to some embodiments, the capping layer CP may be located on the bank portion BK and the color conversion layer CCL. For example, the capping layer CP may cover the bank portion BK and the color conversion layer CCL.

According to some embodiments, the capping layer CP may include an inorganic material. For example, the capping layer CP may include at least one of silicon oxide, silicon oxynitride, and/or the like.

The second substrate 200 may face the first substrate 100. The second substrate 200 may include a second base substrate SUB2, a color filter layer CF, a low refractive index layer LR, a protection layer PL, and a spacer SPC.

The second base substrate SUB2 may face the first base substrate SUB1. As the second base substrate SUB1 includes the first area A1 and the second area A2 as the display device 10 includes the first area A1 and the second area A2.

The second base substrate SUB2 may be an insulating substrate made of a transparent material. The second base substrate SUB2 may include glass or plastic.

The color filter layer CF may be located under the second base substrate SUB2. The color filter layer CF may include a red color filter pattern CFR, a green color filter pattern CFG, and a blue color filter pattern CFB.

The red color filter pattern CFR may overlap the first light emitting area LA1 and may selectively transmit red light. The green color filter pattern CFG may overlap the second light emitting area LA2 and may selectively transmit green light. The blue color filter pattern CFB may overlap the third light emitting area LA3 and may selectively transmit blue light.

According to some embodiments, each of the red color filter pattern CFR, the green color filter pattern CFG, and the blue color filter pattern CFB may be located to more overlap with the blocking area BA. That is, as shown in FIG. 3, the red color filter pattern CFR may overlap the first light emitting area LA1 and the light blocking area BA, and may not overlap the second and third light emitting areas LA2 and LA3.

The green color filter pattern CFG may overlap the second light emitting area LA2 and the blocking area BA, and may not overlap the first and third light emitting areas LA1 and LA3. The blue color filter pattern CFB may overlap the third light emitting area LA3 and the blocking area BA, and may not overlap the first and second light emitting areas LA1 and LA2. In this case, in the blocking area BA, parts of the red, green, and blue color filter patterns CFR, CFG, and CFB may overlap each other in the first direction D1. Accordingly, color mixing between the adjacent first, second, and third light emitting areas LA1, LA2, and LA3 can be prevented or reduced.

For example, in the blocking area BA, the blue color filter pattern CFB may be located under the first base substrate SUB1, the red color filter pattern CFR may be located under the blue color filter pattern CFB, and the green color filter pattern CFG may be located below the red color filter pattern CFR. However, in the embodiments according to the present disclosure, the arrangement order is not limited thereto.

According to some embodiments, the low refractive index layer LR may be located under the color filter layer CF. The low refractive index layer LR may have a lower refractive index than the protection layer PL. The low refractive index layer LR may increase light extraction efficiency and increase luminance and lifetime of the display device 10. For example, the low refractive index layer LR may include an organic material.

The protection layer PL may be located under the low refractive index layer LR. The protection layer PL may protect the low refractive index layer LR from oxygen, moisture ($H_2O$), foreign matter, and the like.

According to some embodiments, the protection layer PL may include an inorganic material. For example, the protection layer PL may include silicon oxide, silicon nitride, silicon oxynitride, and the like. These materials may be used alone or in combination.

According to some embodiments, the spacer SPC may be located under the protection layer PL. The spacer SPC may be located in the light blocking area BA. Although FIG. 3 illustrates that one spacer SPC is located in the light blocking area BA, embodiments according to the present disclosure are not limited thereto. For another example, a plurality of spacers SPC may be formed, and positions where the spacers SPC are formed may be variously determined in the light blocking area BA.

A lower surface of the spacer SPC may contact the capping layer CP. Accordingly, the spacer SPC may maintain a gap between the first substrate 100 and the second substrate 200.

According to some embodiments, the first color conversion portion CCL1 may convert the incident light L1 to emit the first transmission light L2R having red color. The incident light L1 not converted by the first color conversion portion CCL1 may be blocked by the red color filter pattern CFR. Accordingly, in the first light emitting area LA1, the first transmission light L2R having red color passes through the first base substrate SUB1 and may be emitted to the outside (i.e., in the first direction D1).

For example, the wavelength conversion particles CCL2*c* of the second color conversion portion CCL2 may include quantum dots that absorb the incident light L1 and emit green light. Accordingly, the second color conversion portion CCL2 may convert the incident light L1 to emit the second transmission light L2G having a green color. The incident light L1 not converted by the second color conversion portion CCL2 may be blocked by the green color filter pattern CFG. Accordingly, in the second light emitting area LA2, the second transmission light L2G having a green color passes through the first base substrate SUB1 and may be emitted to the outside (i.e., in the first direction D1).

Some of the incident light L1 transmitted through the transmission portion TL may be blocked by the blue color filter pattern CFB. Accordingly, in the third light emitting area LA3, the third transmission light L2B having blue color passes through the first base substrate SUB1 and may be emitted to the outside (i.e., in the first direction D1).

In the first, second, and third light emitting areas LA1, LA2, and LA3, the first, second, and third transmission lights L2R, L2G, and L2B emitted to the outside through the first base substrate SUB1 may be combined. Accordingly, the image may be displayed in the first area A1.

The filling layer FL may be located between the first substrate 100 and the second substrate 200. That is, the filling layer FL may be located between the protection layer PL and the capping layer CP. The filling layer FL may cover the capping layer CP and may contact the capping layer CP.

FIG. 5 is a cross-sectional view taken along the line III-III' of FIG. 4.

Referring further to FIG. 5, according to some embodiments, the capping layer CP may directly contact the side surface BKa of the bank portion BK. A thickness T of the capping layer CP overlapping the side surface BKa of the bank portion BK may range from about 1500 Å to about 10000 Å. Hereinafter, the range of the thickness T of the capping layer CP may be the range of the thickness T of a part of the capping layer CP overlapping the side surface BKa of the bank portion BK.

The display device 10 may be manufactured at a relatively low temperature (e.g., about 75° C.). In this case, outgassing may increase in layers under the capping layer CP due to a decrease in process temperature. When the range of the thickness T of the capping layer CP is less than about 1500 Å, outgas may pass through the capping layer CP and be discharged to the outside. An additional chemical reaction may occur in the display device 10 due to the outgas, and through this, luminous efficiency of the display device 10 may be reduced.

When the range of the thickness T of the capping layer CP is greater than about 10000 Å, the amount of material forming the capping layer CP increases, thereby increasing manufacturing cost and increasing the tact time. Thus, the efficiency of the manufacturing process of the display device 10 may decrease.

The thickness T of the capping layer CP overlapping the side surface BKa of the bank portion BK may be smaller than a thickness of the capping layer CP overlapping the upper surface of the bank portion BK. However, the present disclosure is not limited thereto.

According to some embodiments, the capping layer CP may include a first layer CPL1 and a second layer CPL2. The first layer CPL1 may cover the bank portion BK and the color conversion layer CCL, and may directly contact the bank portion BK and the color conversion layer CCL. That is, the first layer CPL1 may directly contact the side surface BKa of the bank portion BK in the dummy opening DOP. That is, the second layer CPL2 may be located on the first layer CPL1. The second layer CPL2 may directly contact the filling layer FL.

According to some embodiments, the first layer CPL1 may include silicon oxide. In addition, the second layer CPL2 may include silicon oxynitride. Oxidation resistance of the capping layer CP may be relatively improved by contacting the first layer CPL1 including silicon oxide with the bank portion BK. Because the capping layer CP is not oxidized, the entire filling layer FL contacting the capping layer CP can be hardened. Because the uncured part of the filling layer FL does not occur, outgassing caused by the uncured filling layer FL can be prevented or reduced. Accordingly, luminous efficiency of the display device 10 can be relatively improved.

In addition, because the second layer CPL2 containing silicon oxynitride is located on the first layer CPL1, the second layer CPL2 can effectively prevent or reduce outgassing. Accordingly, reliability of the display device 10 may be relatively improved.

According to some embodiments, the capping layer CP may include the first layer CPL1 directly contacting the bank portion BK and including silicon oxide and the second layer CPL2 located on the first layer CPL1 and including silicon oxynitride. Accordingly, the oxidation resistance of the capping layer CP can be relatively improved, and the capping layer CP may effectively prevent or reduce outgassing from being released. Accordingly, the luminous efficiency and reliability of the display device 10 can be relatively improved.

Figure 6:
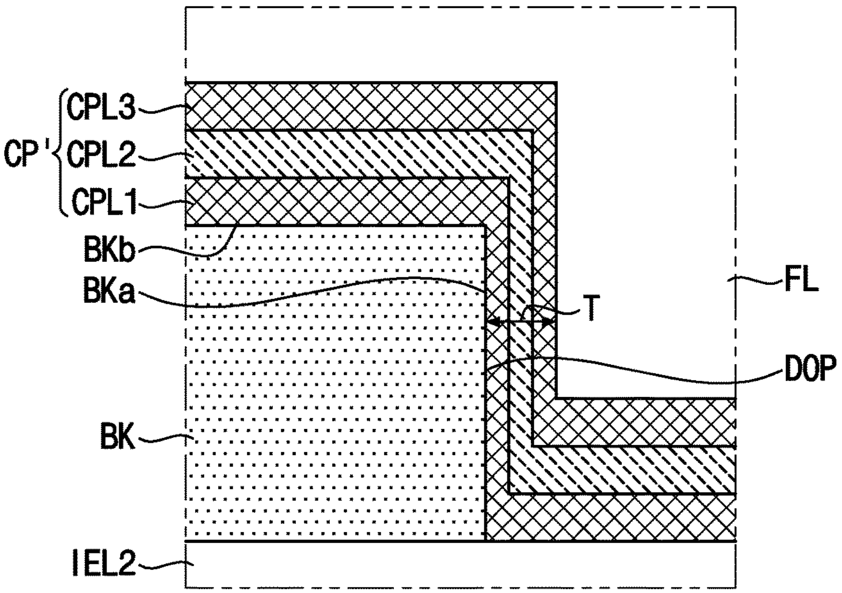
FIG. 6 is a cross-sectional view illustrating another example of FIG. 5 according to some embodiments of the present disclosure.

FIG. 6 is a cross-sectional view illustrating another example of FIG. 5.

The capping layer CP described with reference to FIG. 6 may be the same as the capping layer CP described with reference to FIG. 5 except for the presence or absence of a third layer CPL3. Accordingly, some redundant descriptions may be omitted or simplified.

Referring to FIG. 6, according to some embodiments, a capping layer CP' may include the first layer CPL1, the second layer CPL2, and the third layer CPL3. The first layer CPL1 may cover the bank portion BK and the color conversion layer CCL, and may directly contact the bank portion BK and the color conversion layer CCL. That is, the first layer CPL1 may directly contact the side surface BKa of the bank portion BK in the dummy opening DOP. The second layer CPL2 may be located on the first layer CPL1. The third layer CPL3 may be located on the second layer CPL2. That is, the third layer CPL3 may directly contact the filling layer FL.

According to some embodiments, the first layer CPL1 may include silicon oxide. The second layer CPL2 may include silicon oxynitride. The third layer CPL3 may include silicon oxide. Oxidation resistance of the capping layer CP can be relatively improved by contacting the first layer CPL1 including silicon oxide with the bank portion BK.

In addition, because the third layer CPL3 including silicon oxide is further located on the second layer CPL2, the third layer CPL3 may more effectively prevent or reduce outgassing from being released. Accordingly, reliability of the display device 10 may be relatively improved.

According to some embodiments, the capping layer CP may directly contact the side surface BKa of the bank portion BK. The thickness T of the capping layer CP overlapping the side surface BKa of the bank portion BK may range from about 1500 Å to about 10000 Å. Accordingly, the capping layer CP can effectively prevent or reduce outgassing, and manufacturing cost and tact time can be reduced, thereby relatively improving manufacturing process efficiency.

Figure 7:
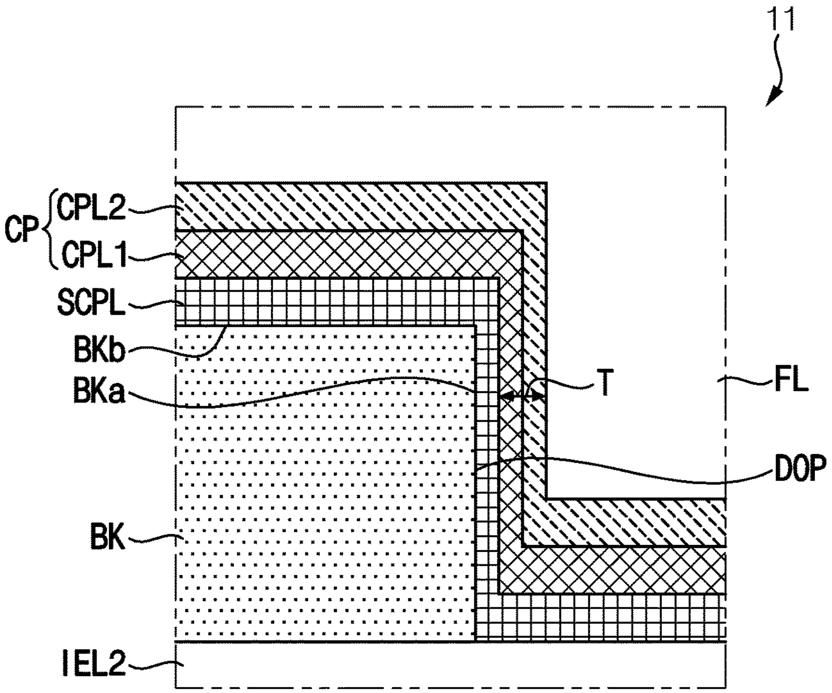
FIG. 7 is a cross-sectional view illustrating another example of FIG. 5 according to some embodiments of the present disclosure.

FIG. 7 is a cross-sectional view illustrating another example of FIG. 5. A display device 11 described with reference to FIG. 7 may be the same as the display device 10 described with reference to FIG. 5 except for the presence or absence of a sub-capping layer CP. Accordingly, some redundant descriptions may be omitted or simplified.

Referring to FIG. 7, the display device 11 may further include the sub-capping layer CP. The sub-capping layer CP may be located between the bank portion BK and the capping layer CP. That is, the sub-capping layer CP may cover the bank portion BK and the color conversion layer CCL, and may directly contact the side surface BKa of the bank portion BK.

According to some embodiments, the sub capping layer CP may include silicon oxynitride. The content of nitrogen included in silicon oxynitride constituting the sub-capping layer CP may be about 10 at % to about 40 at %. In this case, the content of nitrogen included in the silicon oxynitride constituting the second layer CPL2 may be less than about 10 at %. However, the present disclosure is not limited thereto.

When the content of nitrogen included in the silicon oxynitride constituting the sub-capping layer CP is less than about 10 at %, a Si—N—H bond may not be formed well. Accordingly, an empty space inside the sub-capping layer CP may increase, and as a result, a plurality of seams may be formed in the sub-capping layer CP. Therefore, external materials may permeate and remain in the color conversion layer CCL from an upper part of the sub-capping layer CP through the shim, and thus reliability of the display device 10 may deteriorate.

When the content of nitrogen included in the silicon oxynitride is greater than about 40 at %, existing characteristics of the sub-capping layer CP may be changed. Accordingly, the luminance or transmittance of the display device 10 may decrease, and the display device 10 may be oxidized and degenerated (i.e., reliability decrease).

Figure 8:
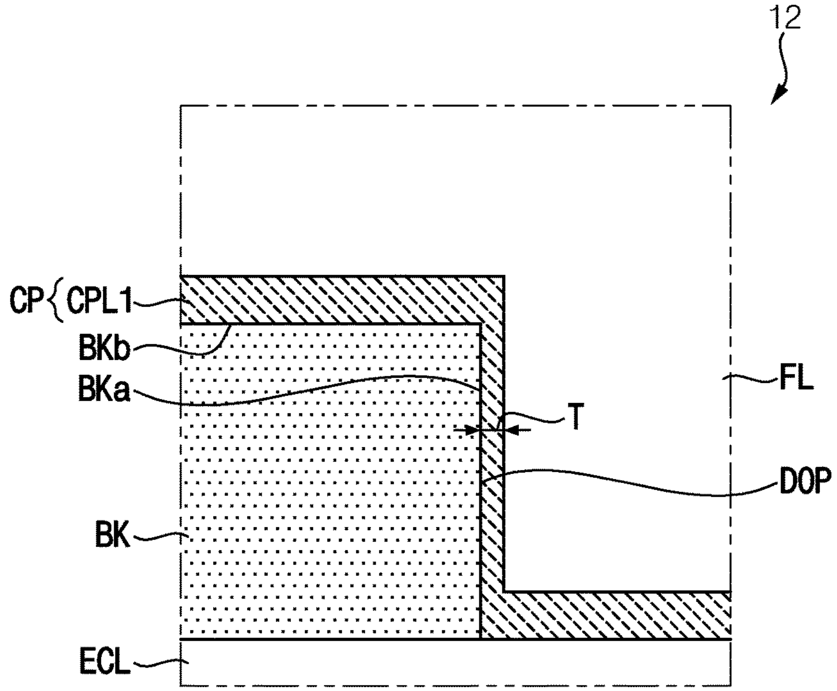
FIG. 8 is a cross-sectional view illustrating a part of a display device according to some embodiments of the present disclosure.

FIG. 8 is a cross-sectional view illustrating a part of a display device according to some embodiments of the present disclosure.

For example, FIG. 8 may be a view illustrating only the encapsulation layer ECL, the bank portion BK, the capping layer CP, and the filling layer FL included in a display device 12. In addition, the display device 12 described with reference to FIG. 8 may be the same as the display device 10 described with reference to FIG. 5 except for a capping layer CP. Accordingly, some redundant descriptions may be omitted or simplified.

Referring to FIGS. 3, 4, and 8, the display device 12 may include the first substrate 100, a sealing member, and the second substrate 200.

The first substrate 100 may include the first base substrate SUB1, the display structure DP, the bank portion BK, the color conversion layer CCL, and the capping layer CP. The display structure DP may be located on the first base substrate SUB1. The bank portion BK and the color conversion layer CCL may be located on the display structure DP. The display structure DP may include the buffer layer BFR, the first, second, and third driving elements TR1, TR2, and TR3, the insulating layer IL, the pixel defining layer PDL, the first, second, and third light emitting diodes LED1, LED2, and LED3, and the encapsulation layer ECL.

The second substrate 200 may face the first substrate 100. The second substrate 200 may include the second base substrate SUB2, the color filter layer CF, the low refractive index layer LR, the protection layer PL, and the spacer SPC.

The bank portion BK may be located on the encapsulation layer ECL. The bank portion BK may define the pixel opening POP and the dummy opening DOP. The pixel opening POP may define the pixels PX. The pixel opening POP may accommodate an ink composition in the process of forming the color conversion layer CCL. The dummy opening DOP may be adjacent to the pixel opening POP. The dummy opening DOP may be an opening in which the color conversion layer CCL is not located.

According to some embodiments, the dummy opening DOP may include seven or less sub-dummy openings SDOP. For example, the dummy opening DOP may include one sub-dummy opening SDOP. The shape of the sub-dummy opening SDOP may be a circular or a polygon with octagons or less. For example, the shape of the sub-dummy opening SDOP may be a rectangle. However, embodiments according to the present disclosure are not limited thereto.

The thickness of the part of the capping layer CP overlapping the side surface BKa of the bank portion BK may be smaller than the thickness of the part of the capping layer CP overlapping the upper surface BKb of the bank portion BK. Accordingly, the part of the capping layer CP overlapping the side surface BKa of the bank portion BK can be easily oxidized. When the dummy opening DOP includes seven or less sub-dummy openings SDOP, the number of surfaces of the capping layer CP overlapping the side surface BKa of the bank portion BK may be reduced. As a result, an area oxidized in the capping layer CP can be reduced.

Similarly, when the shape of the sub-dummy opening SDOP is a polygon with octagons or less, the number of surfaces of the capping layer CP overlapping the side surface BKa of the bank portion BK may be reduced. As a result, an area oxidized in the capping layer CP can be reduced. Accordingly, the filling layer FL contacting the capping layer CP can be hardened, and reliability of the display device 12 may be relatively improved.

The color conversion layer CCL may be located in the pixel opening POP of the bank portion BK. The color conversion layer CCL may be located on the encapsulation layer ECL. The color conversion layer CCL may include color conversion portions spaced apart from each other. According to some embodiments, the color conversion layer CCL may include the first color conversion portion CCL1, the second color conversion portion CCL2, and the transmission portion TL. The first color conversion portion CCL1, the second color conversion portion CCL2, and the transmission portion TL may be located on the encapsulation layer ECL, and overlap the first, second, and third light emitting areas LA1, LA2, and LA3, respectively. For example, the first color conversion portion CCL1, the second color conversion portion CCL2, and the transmission portion TL may be respectively located in the pixel opening POP of the bank portion BK.

According to some embodiments, the capping layer CP may be located on the bank portion BK and the color conversion layer CCL. For example, the capping layer CP may cover the bank portion BK and the color conversion layer CCL.

According to some embodiments, the capping layer CP may include only a first layer CPL1. The first layer CPL1 may be located on the bank portion BK in the dummy opening DOP. The first layer CPL1 may directly contact the side surface BKa of the bank portion BK in the dummy opening DOP.

According to some embodiments, the thickness T of the first layer CPL1 overlapping the side surface BKa of the bank portion BK may range from about 1500 Å to about 10000 Å. Hereinafter, the range of the thickness T of the first layer CPL1 may be the range of the thickness T of a part of the first layer CPL1 overlapping the side surface BKa of the bank portion BK. In addition, the first layer CPL1 may include silicon oxynitride.

Because the first layer CPL1 including silicon oxynitride is located on the bank portion BK, the capping layer CP can effectively prevent or reduce outgassing. In addition, because the range of the thickness T of the first layer CPL1 is between about 1500 Å and about 10000 Å, even when the bank portion BK and the first layer CPL1 directly contact each other, an oxidation rate of the first layer CPL1 can be reduced.

Accordingly, reliability of the display device 12 can be relatively improved by the capping layer CP effectively preventing or reducing outgassing and reducing an oxidation rate.

Figure 9:
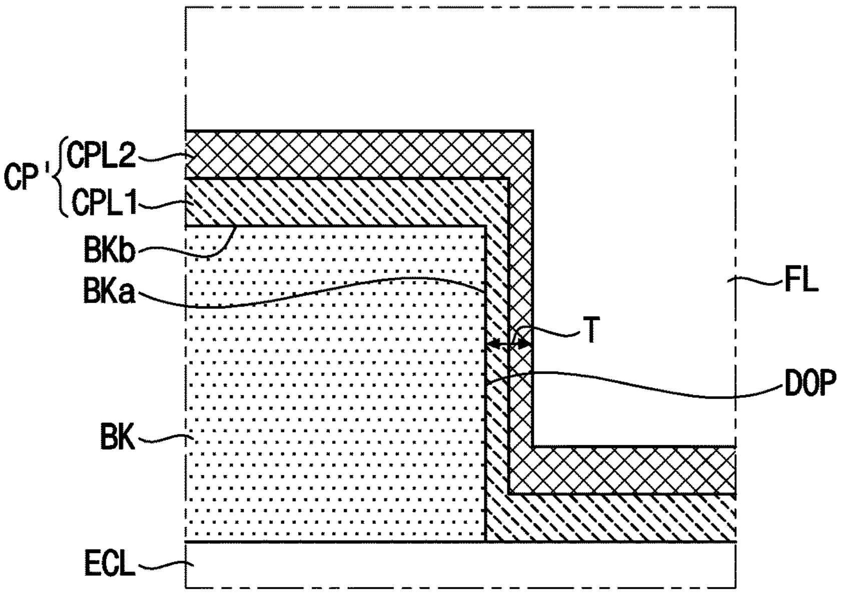
FIG. 9 is a cross-sectional view illustrating another example of FIG. 8 according to some embodiments of the present disclosure.

FIG. 9 is a cross-sectional view illustrating another example of FIG. 8. The capping layer CP described with reference to FIG. 9 may be the same
as the capping layer CP described with reference to FIG. 8 except for the presence or absence of a second layer CPL2. Accordingly, some redundant descriptions may be omitted or simplified.

Referring to FIG. 9, according to some embodiments, a capping layer CP' may include a first layer CPL1 and a second layer CPL2. The first layer CPL1 may cover the bank portion BK and the color conversion layer CCL, and may directly contact the bank portion BK and the color conversion layer CCL. That is, the first layer CPL1 may directly contact the side surface BKa of the bank portion BK in the dummy opening DOP. The second layer CPL2 may be located on the first layer CPL1. That is, the second layer CPL2 may directly contact the filling layer FL.

According to some embodiments, the first layer CPL1 may include silicon oxynitride. The second layer CPL2 may include silicon oxide.

In addition, because the second layer CPL2 including silicon oxide is further located on the first layer CPL1, the capping layer CP' can more effectively prevent or reduce the release of outgas. Accordingly, reliability of the display device 12 can be relatively improved.

According to some embodiments, the first layer CPL1 may directly contact the side surface BKa of the bank portion BK. The thickness T of the first layer CPL1 overlapping the side surface BKa of the bank portion BK may range from about 1500 Å to about 10000 Å.

Figure 10:
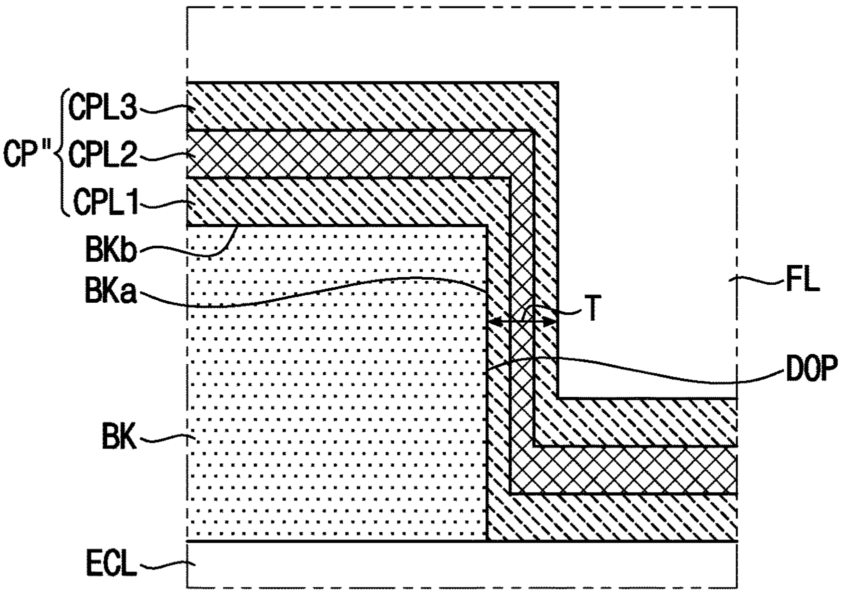
FIG. 10 is a cross-sectional view illustrating another example of FIG. 9 according to some embodiments of the present disclosure.

FIG. 10 is a cross-sectional view illustrating another example of FIG. 9. A capping layer CP" described with reference to FIG. 10 may be the same as the capping layer CP' described with reference to FIG. 9 except for the presence or absence of a third layer CPL3. Accordingly, some redundant descriptions may be omitted or simplified.

Referring to FIG. 10, according to some embodiments, the capping layer CP" may include the first layer CPL1, the second layer CPL2, and the third layer CPL3. The first layer CPL1 may cover the bank portion BK and the color conversion layer CCL, and may directly contact the bank portion BK and the color conversion layer CCL. That is, the first layer CPL1 may directly contact the side surface BKa of the bank portion BK in the dummy opening DOP. The second layer CPL2 may be located on the first layer CPL1. The third layer CPL3 may be located on the second layer CPL2. That is, the third layer CPL3 may directly contact the filling layer FL.

According to some embodiments, the first layer CPL1 may include silicon oxynitride. The second layer CPL2 may include silicon oxide. The third layer CPL3 may include silicon oxynitride. In addition, because the third layer CPL3 including silicon oxynitride is further located on the second layer CPL2, the capping layer CP" can more effectively prevent or reduce the release of outgas. Accordingly, reliability of the display device 12 can be relatively improved.

Figure 11:
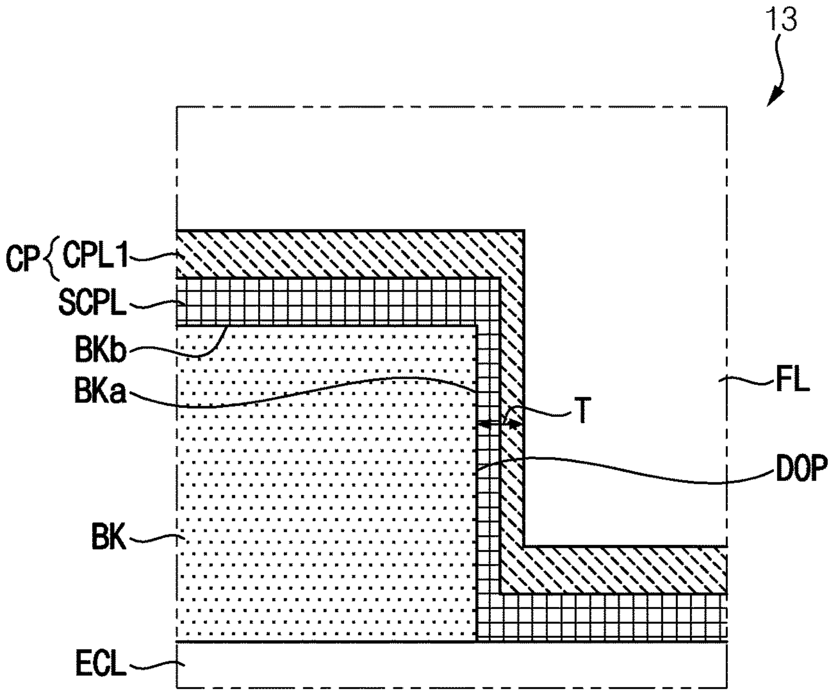
FIG. 11 is a cross-sectional view illustrating still another example of FIG. 8 according to some embodiments of the present disclosure.
Figure 12:
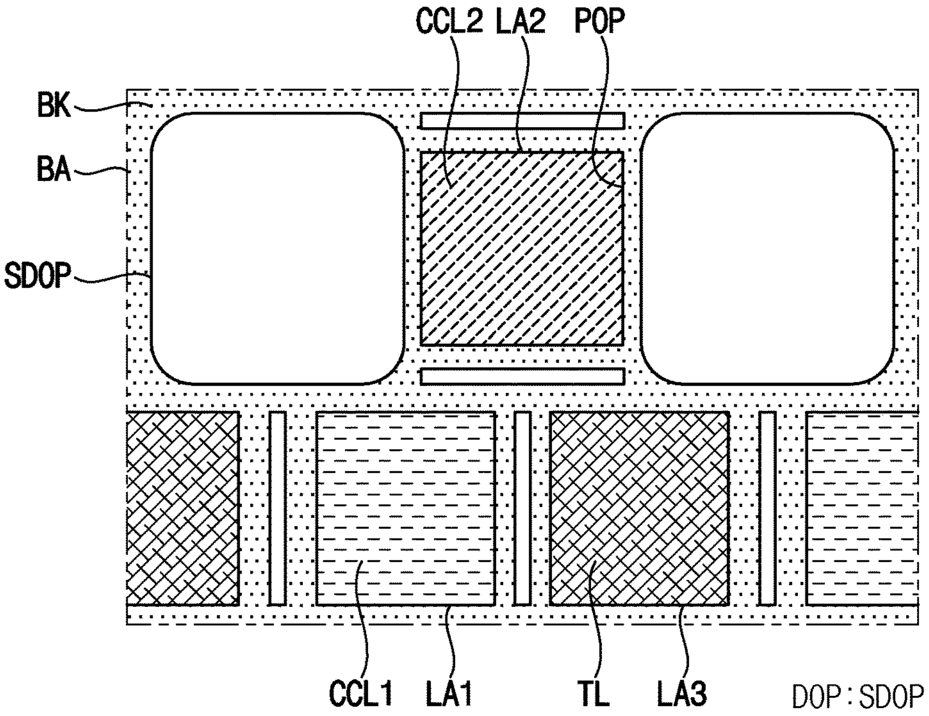
FIGS. 12 to 21 are plan views illustrating other embodiments of FIG. 4 according to some embodiments of the present disclosure.
Figure 13:
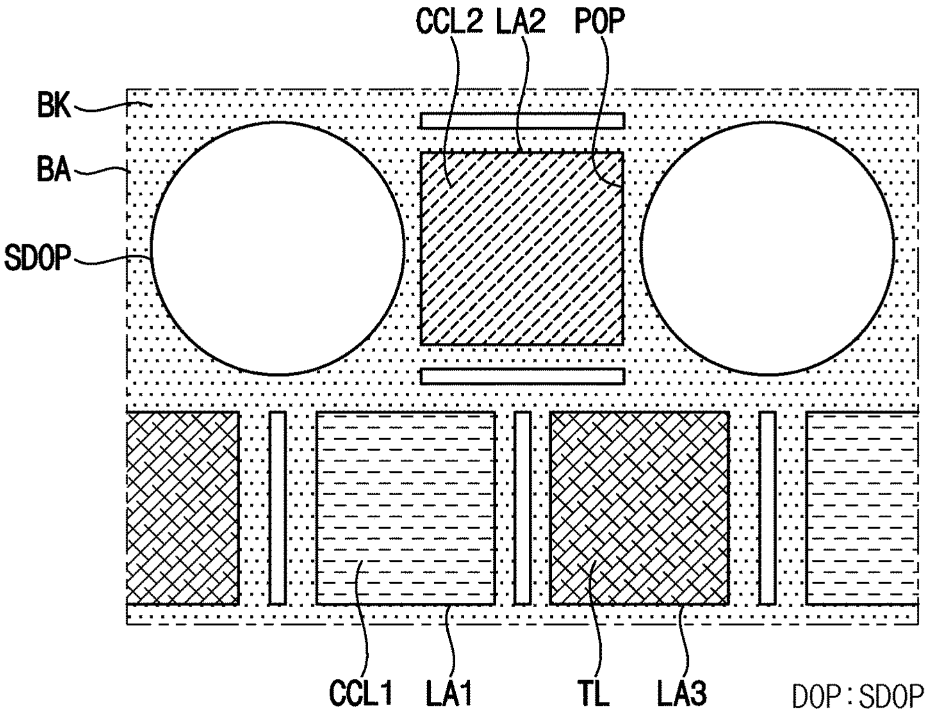
Figure 14:
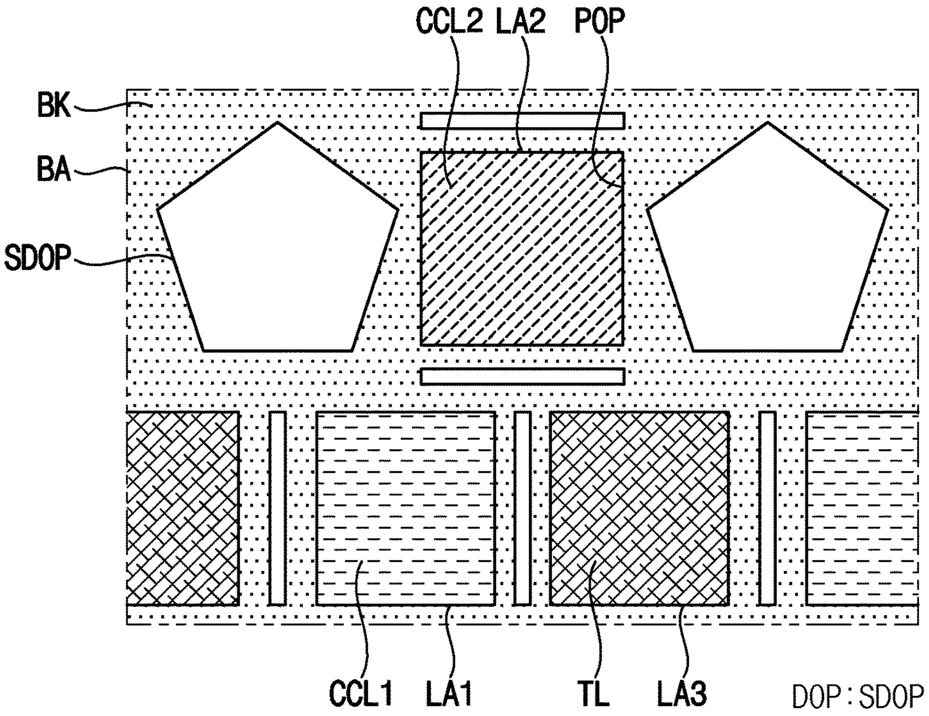
Figure 15:
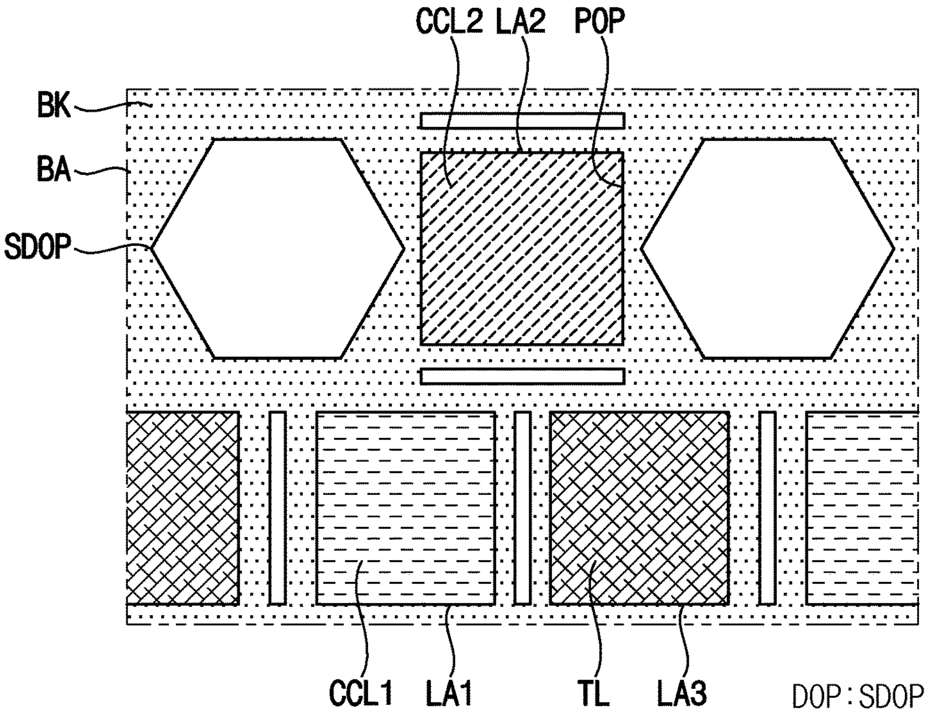
Figure 16:
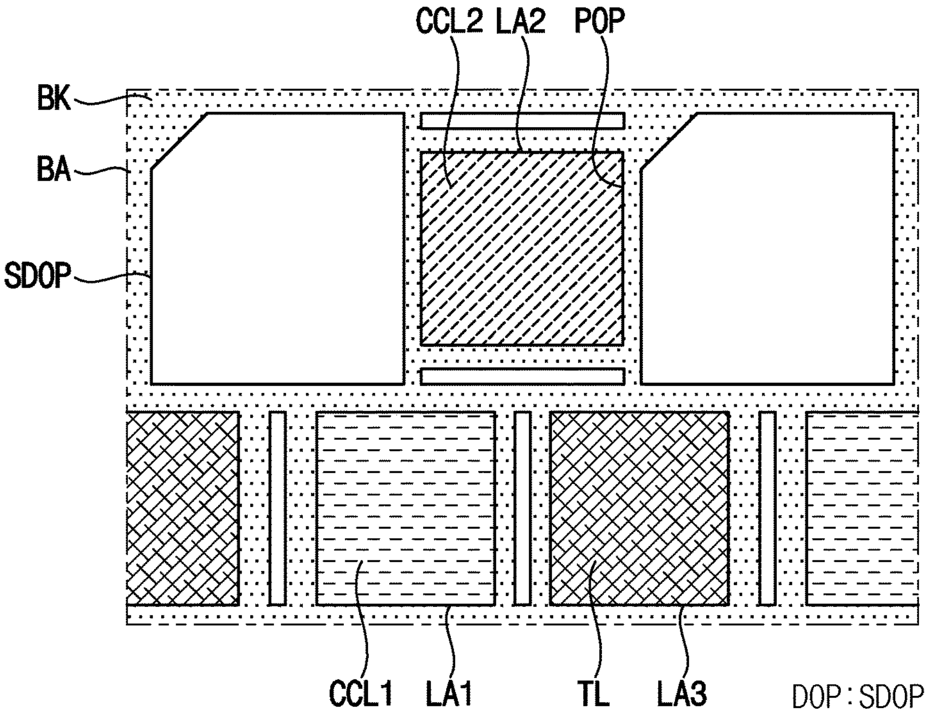
Figure 17:
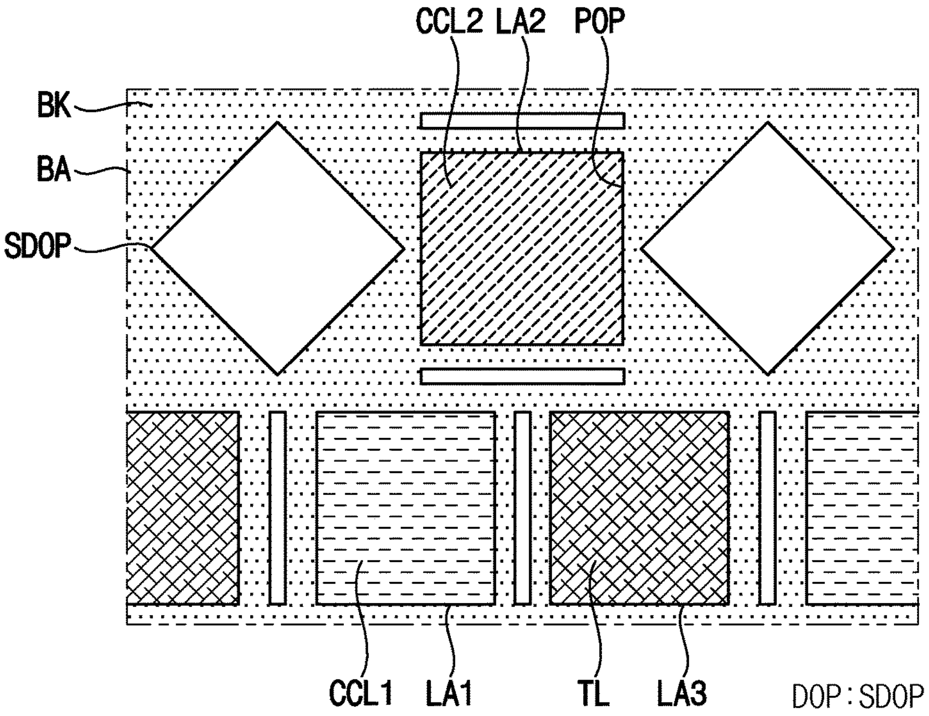

FIG. 11 is a cross-sectional view illustrating still another example of FIG. 8.

A display device 13 described with reference to FIG. 11 may be the same as the display device 12 described with reference to FIG. 8 except for the presence or absence of a sub-capping layer SCPL. Accordingly, redundant descriptions may be omitted or simplified.

Referring to FIG. 11, the display device 13 may further include a sub-capping layer SCPL. The sub-capping layer SCPL may be located between the bank portion BK and the capping layer CP. That is, the sub-capping layer SCPL may cover the bank portion BK and the color conversion layer CCL, and may directly contact the side surface BKa of the bank portion BK.

According to some embodiments, the sub-capping layer SCPL may include silicon oxynitride. The content of nitrogen included in silicon oxynitride constituting the sub-capping layer SCPL may be about 10 at % to about 40 at %. In this case, the content of nitrogen included in the silicon oxynitride constituting the first layer CPL1 may be less than about 10 at %. However, embodiments according to the present disclosure are not limited thereto.

When the nitrogen content of the silicon oxynitride constituting the sub-capping layer SCPL is about 10 at % to about 40 at %, a Si—N—H bond may be well formed. Thus, an empty space inside the sub-capping layer SCPL may be reduced. Therefore, the sub-capping layer SCPL may prevent or reduce instances of external materials or contaminants penetrating and remaining in the color conversion layer CCL from an upper part of the sub-capping layer SCPL. In addition, during the manufacturing process of the sub-capping layer SCPL, plasma damage due to a chemical vapor deposition (CVD) process can be reduced. Accordingly, reliability of the display device 13 may be relatively improved.

FIGS. 12 to 21 are plan views illustrating other embodiments of FIG. 4. Referring to FIGS. 12 to 21, the first, second, and third light emitting areas LA1, LA2, and LA3 may be spaced apart from each other in the plan view and may be arranged to repeat each other. The light blocking area BA may surround the first, second, and third light emitting areas LA1, LA2, and LA3 in the plan view. For example, the light blocking area BA may have a grid shape in the plan view.

The bank portion BK may define the pixel opening POP and the dummy opening DOP. The pixel opening POP may define the pixels PX. For example, the pixel opening POP of the bank portion BK may expose the first, second, and third light emitting areas LA1, LA2, and LA3, respectively. The pixel opening POP may accommodate an ink composition in the process of forming the color conversion layer CCL. The dummy opening DOP may be adjacent to the pixel opening POP. The dummy opening DOP may be an opening in which the color conversion layer CCL is not located. For example, the bank portion BK may entirely overlap the light blocking area BA and may have a grid shape in the plan view.

According to some embodiments, the dummy opening DOP may include seven or less sub-dummy openings SDOP. The shape of the sub-dummy opening SDOP may be a circular or a polygon with octagons or less. Alternatively, when the shape of the sub-dummy opening SDOP is a polygon, corners of the polygon may be rounded. However, embodiments according to the present disclosure are not limited thereto.

Referring to FIGS. 12 to 17, for example, the dummy opening DOP may include one sub-dummy opening SDOP. For example, the shape of the sub-dummy opening SDOP may be a rectangle with rounded corners (see FIG. 12). For another example, the shape of the sub-dummy opening SDOP may be circular or elliptical (see FIG. 13). For another example, the shape of the sub-dummy opening SDOP may have a pentagonal, a hexagonal, a heptagonal, or an octagonal (see FIGS. 14 and 15). As another example, the shape of the sub-dummy opening SDOP may be a rectangle in which at least one corner is chamfered (see FIG. 16). As another example, the shape of the sub-dummy opening SDOP may be a rhombus (see FIG. 17). However, embodiments according to the present disclosure are not limited thereto.

Figure 18:
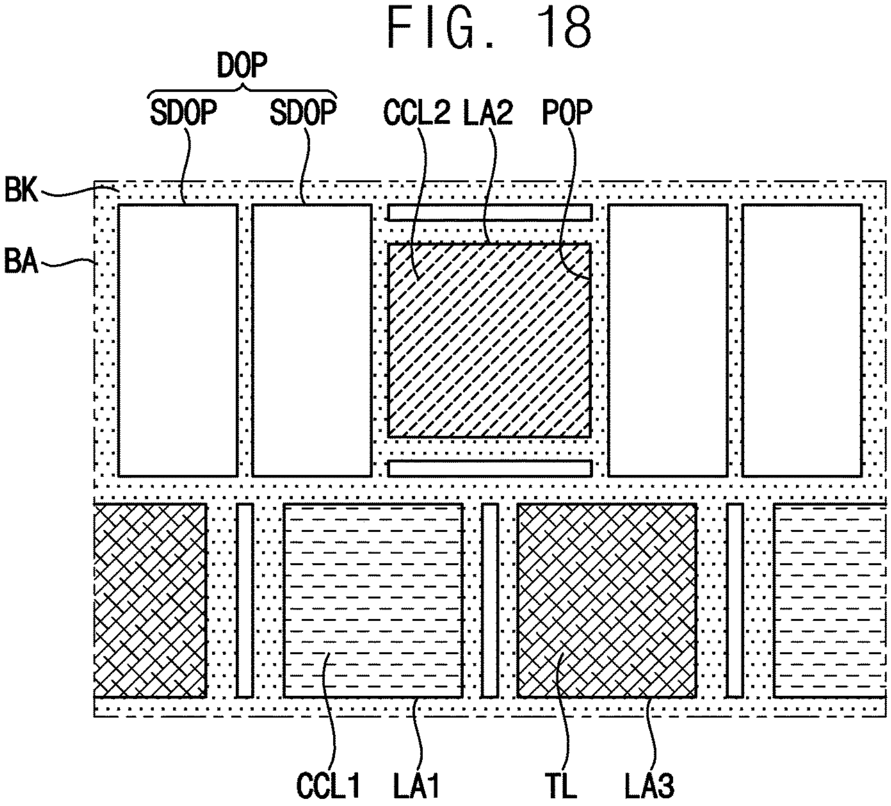
Figure 19:
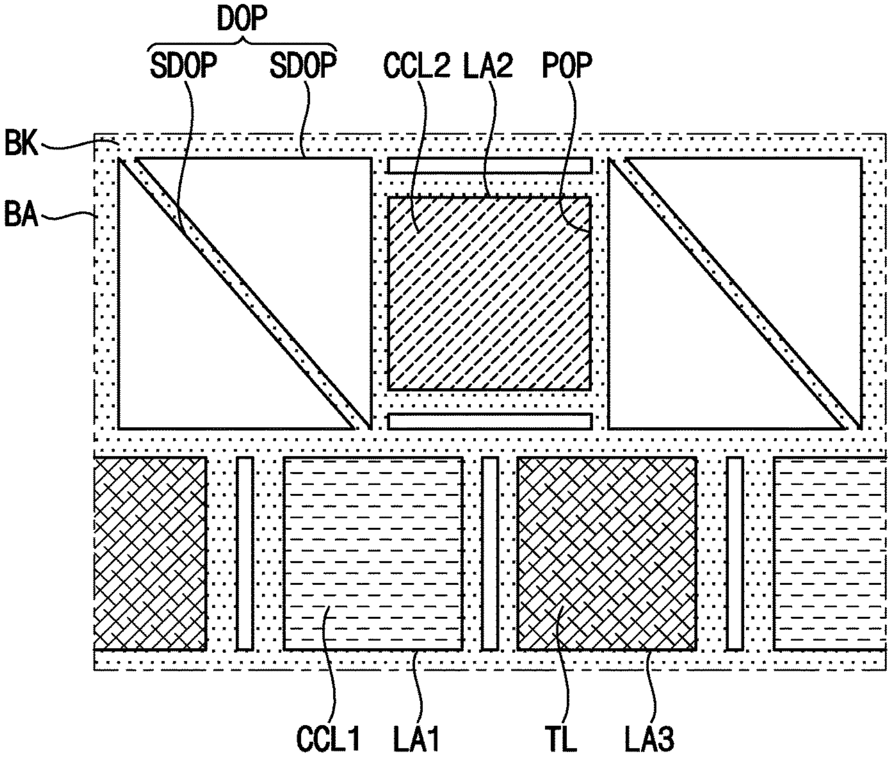
Figure 20:
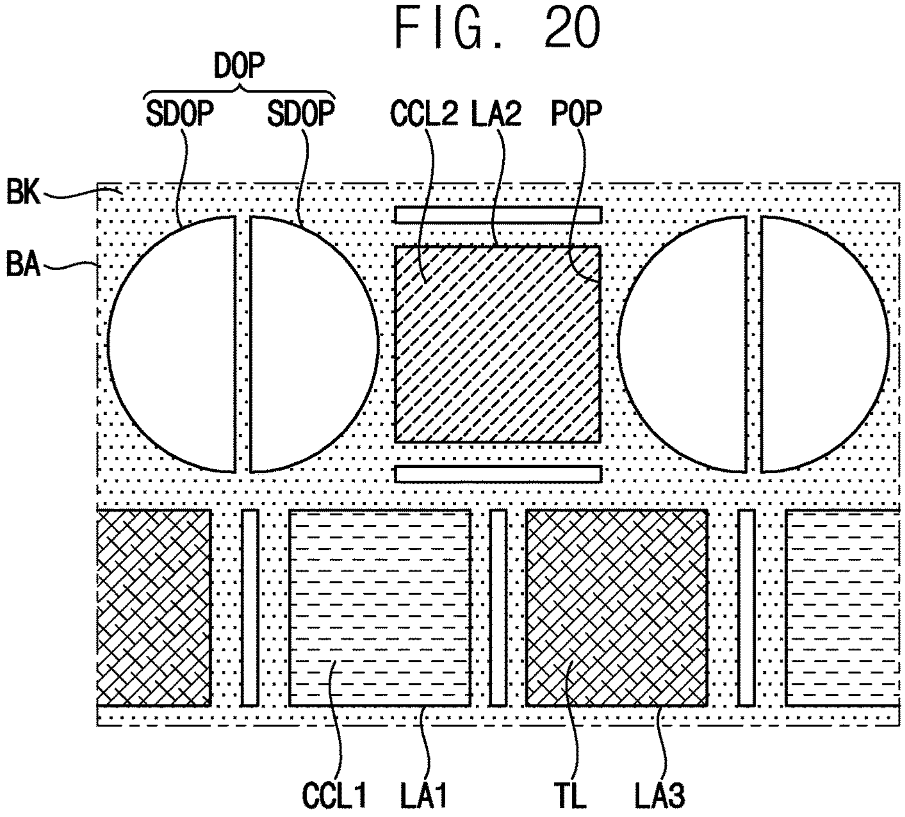

Referring to FIGS. 18 to 20, for example, the dummy opening DOP may include two sub-dummy openings SDOP. For example, the shape of each of the sub-dummy openings SDOP may have a rectangular (see FIG. 18). For another example, the shape of each of the sub-dummy openings SDOP may have a triangular (see FIG. 19). As another example, the shape of each of the sub-dummy openings SDOP may have a semicircular (or a chord shape) (see FIG. 20). However, embodiments according to the present disclosure are not limited thereto.

Figure 21:
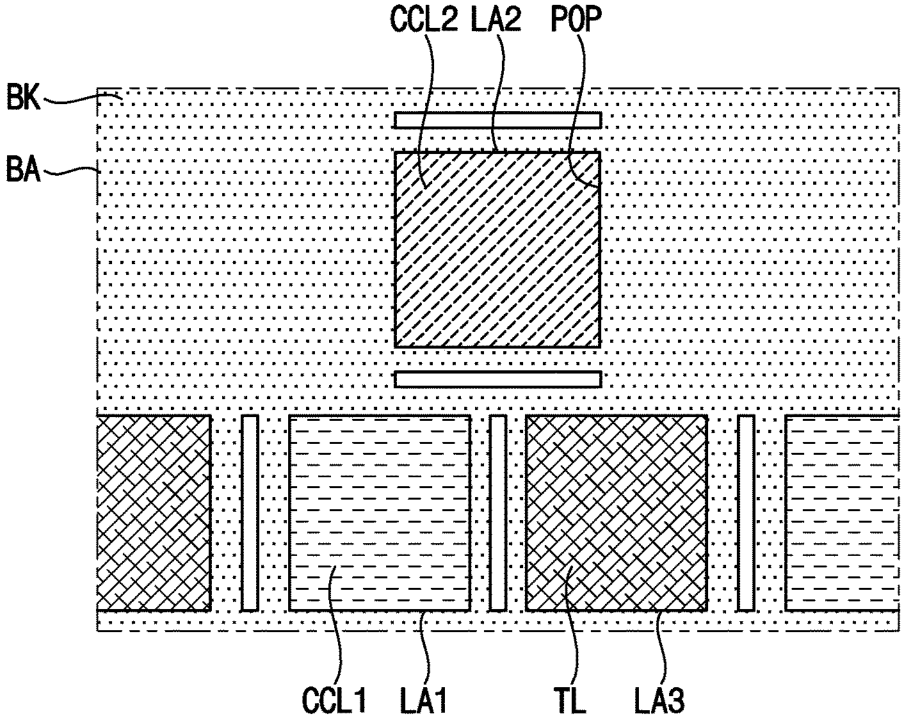

Referring to FIG. 21, for example, only the pixel opening POP may be defined in the bank portion BK, and the dummy opening may not be defined. However, the present disclosure is not limited thereto.

According to some embodiments, when the dummy opening DOP includes seven or less sub-dummy openings SDOP and the shape of the sub-dummy opening SDOP is an octagon or a polygon with octagons or less, the number of surfaces of the capping layer CP overlapping the side surface BKa of the bank portion BK may be reduced. As a result, an area oxidized in the capping layer CP can be reduced. Accordingly, the filling layer FL contacting the capping layer CP can be hardened, and reliability of the display device 10 may be relatively improved.

A display device according to some embodiments of the present disclosure can be applied to display devices included in computers, laptop computers, mobile phones, smart phones, smart pads, automobiles, PMPs, PDAs, MP3 players, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims, and their equivalents. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A display device comprising:
 a first base substrate comprising a display area and a non-display area;
 a display structure on the first base substrate in the display area;
 a bank portion on the display structure and defining a pixel opening and a dummy opening in the display area and adjacent to the pixel opening;
 a color conversion layer in the pixel opening of the bank portion; and
 a capping layer covering the bank portion and the color conversion layer and including:
  a first layer on the bank portion and including silicon oxide; and
  a second layer on the first layer and including silicon oxynitride in the dummy opening.

2. The display device of claim 1, wherein the first layer directly contacts a side surface of the bank portion in the dummy opening.

3. The display device of claim 2, wherein a thickness of the capping layer overlapping the side surface of the bank portion is in a range of 1500 Å to 10000 Å.

4. The display device of claim 1, wherein the dummy opening in- cludes seven or less sub-dummy openings.

5. The display device of claim 4, wherein a shape of each of the sub-dummy openings is a circle or a polygon with eight sides or less in a plan view.

6. The display device of claim 4, wherein a shape of each of the sub-dummy openings is a polygon and corners of the polygon are rounded in a plan view.

7. The display device of claim 1, further comprising:
 a sub-capping layer between the bank portion and the capping layer, including silicon oxynitride, and having a nitrogen content in a range of 10 at % to 40 at % in the silicon oxynitride.

8. The display device of claim 1, wherein the capping layer includes:
 a third layer on the second layer and including silicon oxide.

9. The display device of claim 1, further comprising:
 a second base substrate facing the first base substrate;
 a color filter layer under the second base substrate; and
 a filling layer between the color filter layer and the capping layer.

10. The display device of claim 1, wherein the display structure includes:
 a driving element on the first base substrate;
 a light emitting diode on the driving element and connected to the driving ele- ment; and
 an encapsulation layer on the light emitting diode.

11. A display device comprising:

a first base substrate comprising a display area and a non-display area;

a display structure on the first base substrate in the display area;

a bank portion on the display structure and defining a pixel opening and a dummy opening in the display area and adjacent to the pixel opening;

a color conversion layer in the pixel opening of the bank portion; and a capping layer covering the bank portion and the color conversion layer and in- cluding a first layer on the bank portion, including silicon oxide in the dummy opening, and having a thickness range in a range of 1500 Å and 10000 Å.

12. The display device of claim 11, wherein the first layer directly contacts a side surface of the bank portion in the dummy opening.

13. The display device of claim 12, wherein the thickness range of the first layer is a thickness range of a part overlapping a side surface of the bank portion.

14. The display device of claim 12, wherein the capping layer further includes:

a second layer on the first layer and including silicon oxide.

15. The display device of claim 11, wherein the dummy opening includes seven or less sub-dummy openings.

16. The display device of claim 15, wherein a shape of each of the sub-dummy openings is a circle or a polygon with eight sides or less in a plan view.

17. The display device of claim 16, wherein when a shape of each of the sub-dummy openings a polygon, a corner of the polygon is rounded.

18. The display device of claim 11, further comprising:

a sub-capping layer between the bank portion and the capping layer, including silicon oxynitride, and having a nitrogen content in a range of 10 at % to 40 at % in the silicon oxynitride.

19. The display device of claim 11, further comprising:

a second base substrate facing the first base substrate;

a color filter layer under the second base substrate; and a filling layer between the color filter layer and the capping layer.

20. The display device of claim 11, wherein the display structure includes:

a driving element on the first base substrate;

a light emitting diode on the driving element and con- nected to the driving element; and an encapsulation layer on the light emitting diode.

* * * * *